United States Patent [19]
Kamei et al.

[11] Patent Number: 5,436,924
[45] Date of Patent: Jul. 25, 1995

[54] SEMICONDUCTOR LASER DEVICE

[75] Inventors: Hidenori Kamei; Atsushi Miki, both of Kanagawa, Japan

[73] Assignee: Sumitomo Electric Industries, Ltd., Osaka, Japan

[21] Appl. No.: 286,431

[22] Filed: Aug. 5, 1994

[30] Foreign Application Priority Data

Aug. 10, 1993 [JP] Japan ................... 5-198569

[51] Int. Cl.6 .......................................... H01S 3/19
[52] U.S. Cl. ........................... 372/46; 372/45
[58] Field of Search ....................... 372/45, 46

[56] References Cited

U.S. PATENT DOCUMENTS 5,353,298  10/1994  Makuta .................. 372/96
5,357,538  10/1994  Tatneau et al. ........ 372/96

OTHER PUBLICATIONS

"Low-Threshold 1.3 μm MQW Laser Array for Optical Interconnections," Akihiko Oka et al, Technical Report of the Institute of Electronics, Information and Communication Engineers, OQE92-168 Feb. 1993.

"Chapter 5 Lateral Mode of the Semi-Conductor Laser", pp. 90-123 (no name, no date).

"1.3 μm InGaAsP/InP Flat-Surface Buried Heterostructure Laser Diode Fabricated on P-type substrate", I. Ushijima et al, *Indium Phosphide and Related Materials for Advanced Electronic and Optical Devices*, SPIE vol. 1144, 1989 pp. 406-411 (no month).

A Takemoto et al., "1.3 μm InGaAsP/InP Distributed-Feedback P-Substrate Partially Inverted Buried-Heterostructure Laser Diode", *Electronics Letters*, May 21, 1987, pp. 546-547.

"Extremely Low Threshold InGaAsP/InP DFB Laser by MOCVD/LPE Hybrid Process" N. Yoshida et al., *Journal of Crystal Growth* 93 (1988) pp. 832-837.

1.3 μm 10-beam Laser Diode Array, K. Matsumoto et al, The Institute of Electronics, Information and Communication Engineers, Technical Report of IEICE OQE92-176 Feb. 1993.

"High-Efficiency InGaAsP/InP flat-Surface Buried Heterostructure Distributed Feedback Lasers at 1.55 μm," K. Wakao et al, *Journal of Applied Physics*, pp. 2153-2154, 62(5), Sep. 1987.

"Leakage Current Analysis in Laser Diodes Using Optical Device Simulator (II)" T. Ishida et al, Kansai Electronics Research Laboratory, NEC Corp. Report No. 30A-C-10 (no year, no month).

"1.3 μm MQW LDs With Extremely Low Operating Current at High Temperature", H. Yamada et al, Kansai Electronics Research Laboratory, NEC Corp.,k Report No. 29a-SF-3 (no year, no month).

"1.3 μm Strained MQW LDs with Low Threshold Current", K. Goto et al., Mitsubishi Electric Corp., Report 18p-V-3 (no year, no month).

"Low Threshold 1.3 μm MQW-LD Arrays Made on P-Substrates" A. Oka et al., Hitachi CLR, Report 16p-V-7 (no year, no month).

"Gallium Arsenide Processing Techniques," Ralph E. Williams, 1984, Artech House, Inc. (no month).

"Modern GaAs Processing Methods," Ralph Williams, Artech House Microwave Library (no year, no month).

*Primary Examiner*—James W. Davie
*Attorney, Agent, or Firm*—Beveridge, DeGrandi, Weilacher & Young

[57] ABSTRACT

Successively formed on an n-type InP substrate are an n-type InP first clad layer 1, an undoped GainAsP first light guide layer 11, an active layer 3 of the multiple quantum well structure arranged with the number of wells being 5 to 10 and the radiation wavelength being about 1.3 μm, an undoped GainAsP second light guide layer 12, and a p-type InP clad layer 2, which are processed to constitute a mesa-type active region. The width of the active layer 3 is not less than 0.7 μm and not more than 1.0 μm, whereby the spectral width can be made not more than 2.5 nm in the temperature range of −45° to +85° C.

5 Claims, 5 Drawing Sheets $W = \frac{1}{2}(L1 + L2)$

SEMICONDUCTOR LASER DEVICE

BACKGROUND OF THE INVENTION

1. Field of the Invention

The present invention relates to a buried semiconductor laser oscillated in a stable transverse mode.

2. Related Background Art

The buried semiconductor laser is used as a light source in optical fiber communications, etc. It has been considered that in the buried semiconductor laser the width of an active layer should be preferably about 1 to 2 μm in order to obtain the fundamental transverse mode, as described in Ryoichi ITO et al., "SEMICONDUCTOR LASER: Fundamentals and Applications," 91-123, 1989, Baifukan.

SUMMARY OF THE INVENTION

In the buried semiconductor laser with the above structural parameter, the fundamental transverse mode is, however, unstable in a certain narrow temperature range and an average width of an oscillation spectrum becomes broader. If a buried semiconductor laser with the oscillation wavelength of about 1.31 μm at the room temperature normally near 25° C. is used in the temperature range of −45° to 85° C. without a temperature control, for example using a Peltier cooler or the like, the oscillation wavelength is shifted from about 1.31 μm to the shorter wavelength side or to the longer wavelength side depending upon a temperature change from the room temperature to the lower temperature side or to the higher temperature side, respectively, because the oscillation wavelength has a temperature coefficient of about 0.4 nm/° C.

On the other hand, optical fibers have so-called wavelength dispersion (normally zero dispersion at about 1.31 μm). Particularly, if the oscillation spectrum width became wider during operation of the buried semiconductor laser at a lower temperature or at a higher temperature than the room temperature, transmission at a high bit rate was impossible because of a difference in propagation speed depending upon the wavelength.

Because of this, the buried semiconductor laser needs to be provided with a separate temperature control mechanism to realize the transmission at a high bit rate. Here, such a problem would be solved at once, if a buried semiconductor laser stable for a temperature change without such a temperature control mechanism could be provided. As for structural parameters of the semiconductor laser, structural parameters of a distributed feedback laser were studied to achieve a high efficiency in "K. WAKAO et al., J. Appl. Phys., 62, 2153, 1987" and the thickness of the active layer was studied to realize the operation at high temperatures in "I. USHIJIMA et al., Proc. Soc. Photo-Opt. Instrum. Eng., 1122, 406, 1989."

Also, "Hirohito YAMADA et al., Extended Abstracts 29a-SF-3 (The Spring Meeting, 1992); The Japan Society of Applied Physics and Related Societies" and "K. MATSUMOTO et al., Technical Report of IEICE, OQE 92-176 (1993-02)" describe an improvement in temperature characteristics by employing the multiple quantum well structure for the active layer, but include no study about the width of the active layer.

Further, "Tomoko ISHIDA et al., Extended Abstracts 30a-C-10 (The Spring Meeting, 1992); The Japan Society of Applied Physics and Related Societies" studied by simulation the optimum value of the width of the active layer to improve the temperature characteristics, describing that the optimum value was 1.6 to 2.0 μm. Also, "Satohiko OKA et al., Extended Abstracts 16p-V-7 (The Autumn Meeting, 1992); The Japan Society of Applied Physics" shows the temperature characteristics of light output from the buried semiconductor laser in case of the width of the active layer being 1.5 μm. "A. OKA et al., Technical Report of IEICE, OQE 92–168 (1993–02)" describes such a study that end faces of a resonator of the buried semiconductor laser are covered with a high-reflection coating, whereby the laser can be operated in a stable manner for a long time.

Also, "Katsuhiko GOTO et al., Extended Abstracts 18p-V-3 (The Autumn Meeting, 1992); The Japan Society of Applied Physics" describes a decrease in threshold current of a 1.3 μm band laser by the strain quantum well structure, but no study was made on the width of the active layer. Further, "N. YOSHIDA et al., J. Crystal Growth, 93,832, 1988" studied the threshold current in setting the width of the active layer of the double heterostructure at about 1 μm in the distributed feedback laser. In addition, "A. TAKEMOTO et al., Electron. Lett. 23, 1987" studied the distributed feedback laser in which the width of the active layer was 1 to 1.5 μm.

The present inventors took the above points into consideration to improve the laser device itself from the viewpoint of the stability to the temperature change. From the point that the stability of the mode to the temperature change and a reduction in threshold current must be achieved in order to improve the characteristics of the buried semiconductor laser, the inventors have extensively and intensively studied and finally obtained a finding that proper adjustment of the structural parameters was effective. Optimizing the parameters, the inventors achieved a practical buried semiconductor laser which was stable to the temperature change and which could perform the transmission at a high bit rate.

To achieve the above buried semiconductor laser, the present invention is directed to a buried semiconductor laser comprising (a) a first clad layer of a first conduction type (for example, a Si-doped n-type InP layer) formed on a semiconductor substrate (for example, a Sn-doped n-type InP substrate), (b) an optical waveguide layer consisting of a first light guide layer (for example, an undoped $Ga_aIn_{1-a}As_bP_{1-b}$ layer (where a=0.15 and b=0.31)) formed on the first clad layer, an active layer of the multiple quantum well structure (for example, the number of wells: 10, $Ga_uIn_{1-u}As_vP_{1-v}$ layers (where u=0.31 and v=0.66) with the thickness of well layer being about 60 angstroms and $Ga_xIn_{1-x}As_yP_{1-y}$ layers (where x=0.15 and y=0.31) with the thickness of barrier layer being about 150 angstroms) formed on the first light guide layer, and a second light guide layer (for example, an undoped $Ga_cIn_{1-c}As_dP_{1-d}$ layer (where c=0.15 and d=0.31)) formed on the active layer, (c) a second clad layer of a second conduction type (for example, a p-type InP layer) formed on the second light guide layer, and (d) a buried layer (for example, a buried layer in lamination structure of a p-type InP layer and an n-type InP layer) provided in contact with the both side surfaces of the optical waveguide layer formed in stripe structure, in which the radiation wavelength of the active layer is about 1.3 μm and the width of the active layer is not less than 0.7 μm but less than 1.0 μm.

According to such an arrangement, the buried semiconductor laser can be operated in a stable mode in the temperature range of −45° to +85° C., because the width of the active layer is less than 1.0 μm. Further, since the width of the active layer is not less than 0.7 μm, the threshold current of the buried semiconductor laser can be not more than 7 mA. The same effect can be enjoyed in case the number of wells in the active layer is 4 to 10 or in case the thickness of the optical waveguide layer is not less than 0.2 μm and not more than 0.3 μm.

DESCRIPTION OF THE PREFERRED EMBODIMENTS

Figure 1A:
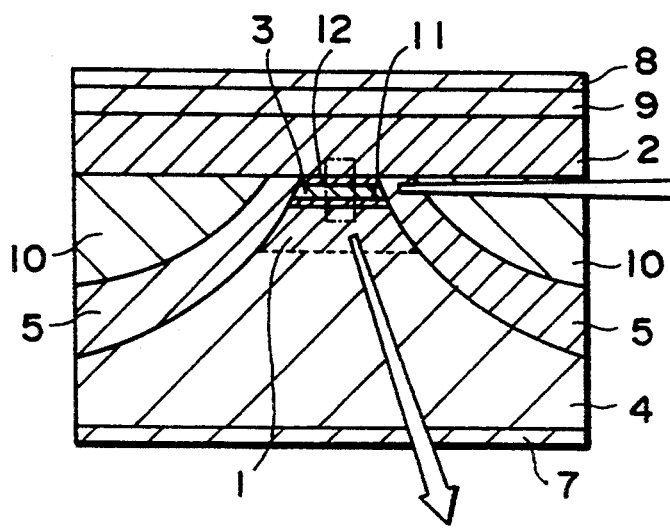
FIG. 1(a), 1(b) and 1(c) are a vertical cross section of a buried semiconductor laser of an embodiment of the present invention.

An embodiment of the present invention will be described with reference to the accompanying drawings. In the description same elements will be denoted by same reference numerals and symbols, and redundant description will be omitted.

(1) Structure of buried semiconductor laser

FIG. 1(a) is a vertical cross section to show the structure of a buried semiconductor laser of the first embodiment of the present invention.

As shown, successively formed on a Sn-doped n-type InP substrate 4 are a Si-doped n-type InP first clad layer 1, an undoped $Ga_aIn_{1-a}As_bP_{1-b}$ (where a=0.15 and b=0.31) first light guide layer 11 (with the thickness of about 500 angstroms and the band gap wavelength of about 1.1 μm), an active layer 3 in the multiple quantum well structure, an undoped $Ga_cIn_{1-c}As_dP_{1-d}$ (where c=0.15 and d=0.31) second light guide layer 12 (with the thickness of about 500 angstroms and the band gap wavelength of about 1.1 μm), and a p-type InP second clad layer 2, which are processed to form a mesa-type active region. Further, a p-type InP buried layer 5 is located to cover the both side surfaces of the mesa-type active region, and an n-type InP buried layer 10 is located further outside the p-type InP buried layer 5. Thus, pnpn structure is constituted by the second clad layer 2, n-type InP buried layer 10, p-type InP buried layer 5, and first clad layer 1, whereby the n-type InP buried layer 10 and p-type InP buried layer 5 can function as a current block layer. An electrode 7 is formed underneath the InP substrate 4, while an electrode 8 is formed through a p-type GaInAs contact layer 9 above the second clad layer 2.

Figure 1C:
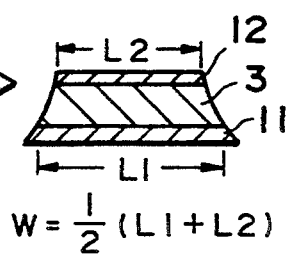
Figure 1B:
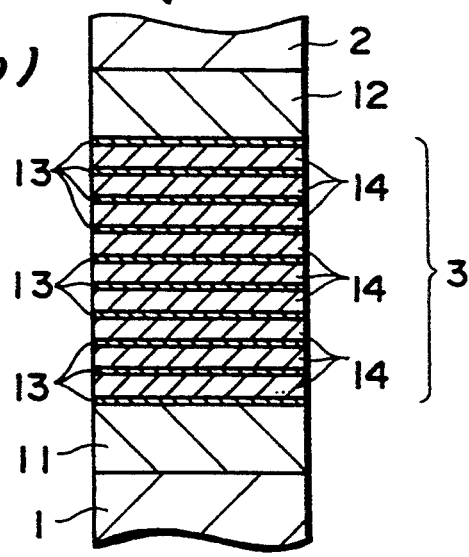

As extracted in the bottom part of the drawing (FIG. 1(b)), the active layer 3 of the multiple quantum well structure is composed of well layers 13 of $Ga_uIn_{1-u}As_vP_{1-v}$ (where u=0.31 and v=0.66) and barrier layers 14 of $Ga_xIn_{1-x}As_yP_{1-y}$ (where x=0.15 and y=0.31), in which the number of wells is 10. The thicknesses of the well layers 13 and the barrier layers 14 are about 60 angstroms and about 150 angstroms, respectively, and the wavelength-converted compositions thereof are about 1.36 μm and about 1.1 μm, respectively. The thickness of the active layer 3 of the multiple quantum well structure is about 0.2 μm (the thickness of the total optical waveguide layer, i.e., active layer 3+first guide layer 11+ second guide layer 12, is 0.3 μm), and the length of the resonator is set as 300 μm and the width of the active layer as 0.9 μm. Here, the width W of the active layer 3 is defined, as shown in (FIG. 1 (c)), as a half of a sum of the upper side L2 and the lower side L1 of the cross section of the active layer of the multiple quantum well structure.

Figure 7:
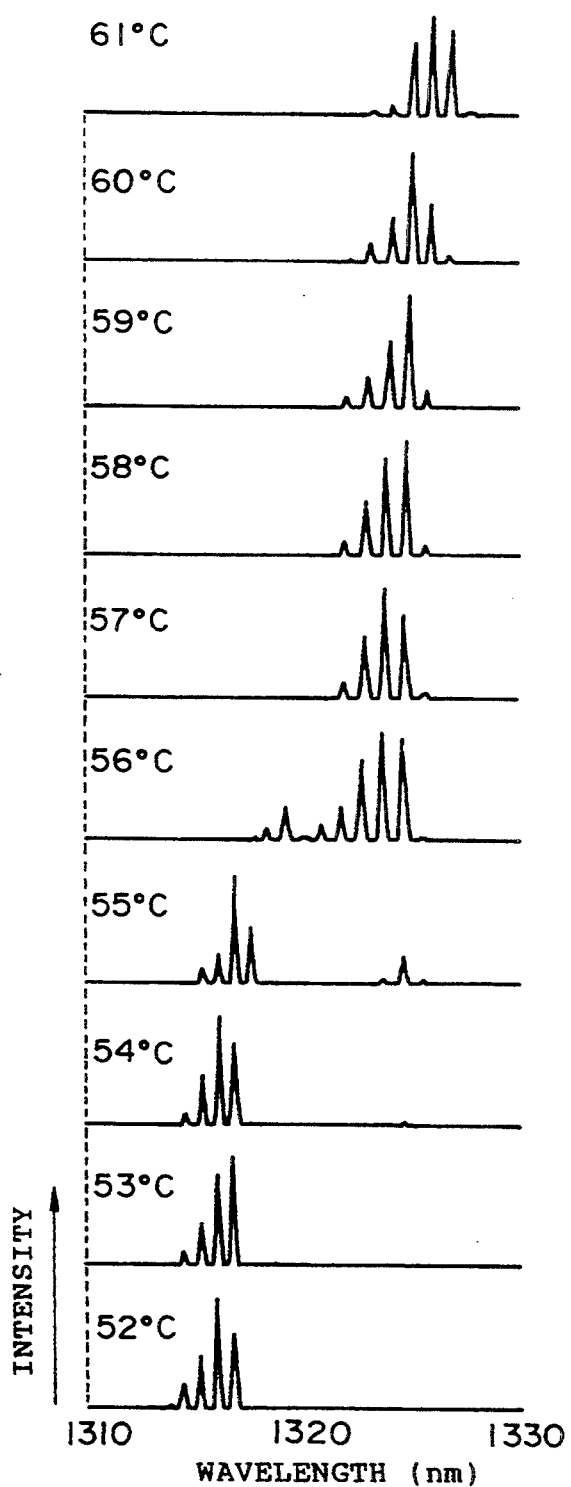
FIG. 7 is a drawing to show temperature dependences of oscillation spectrum where the width of the active layer is not less than 1.0 μm.

In the buried semiconductor laser of this structure and in case of the width of the active layer being 1.2 μm as in the conventional cases, as apparent from the oscillation spectra shown in FIG. 7, the oscillation spectrum has double peaks in the temperature range of 52° to 61° C., broadening the average spectral width. The spread of the spectral width is, however, unclear, because the oscillation spectra on the graphs are drawn in the linear scale.

This spread of the average spectral width results in the wavelength dispersion in transmission through an optical fiber, as described previously, not permitting the transmission at a high bit rate.

Changing the width of the active layer, the present inventors obtained practically effective widths of the active layer in the buried semiconductor laser of the above structure.

Figure 2:
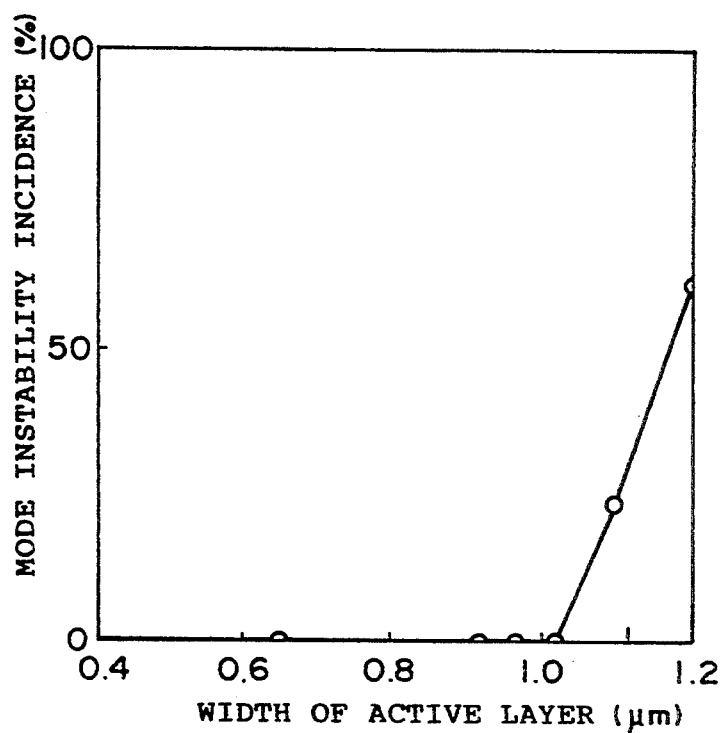
FIG. 2 is a drawing to show dependence of mode instability incidence on the width of the active layer for the buried semiconductor laser of the embodiment of the present invention.

FIG. 2 shows results of measurement in which mode instability incidence was measured against the width of the active layer 3 of the multiple quantum well structure in the temperature range of −45° to +85° C. with the buried semiconductor laser of the above structure.

Here, the mode instability incidence is defined as follows.

Mode instability incidence: a rate of the number of samples causing an unstable state of mode when a plurality of samples (buried semiconductor lasers) were subjected to measurement of wavelength dependence of light intensity in the temperature range of −45° to +85° C. The unstable state of mode means that there are two or more mode groups appearing in a spectrum of light intensity against the wavelength.

In the measurement, the number of measured samples was 10 to 30, temperature intervals in measurement were 5° C., and the light power was 5 mW.

As seen from FIG. 2, the mode instability incidence decreases with a decrease in the width of the active layer 3 of the multiple quantum well structure, and there are few samples to show the unstable state of mode in case of the width being not more than 1.0 μm.

Figure 3:
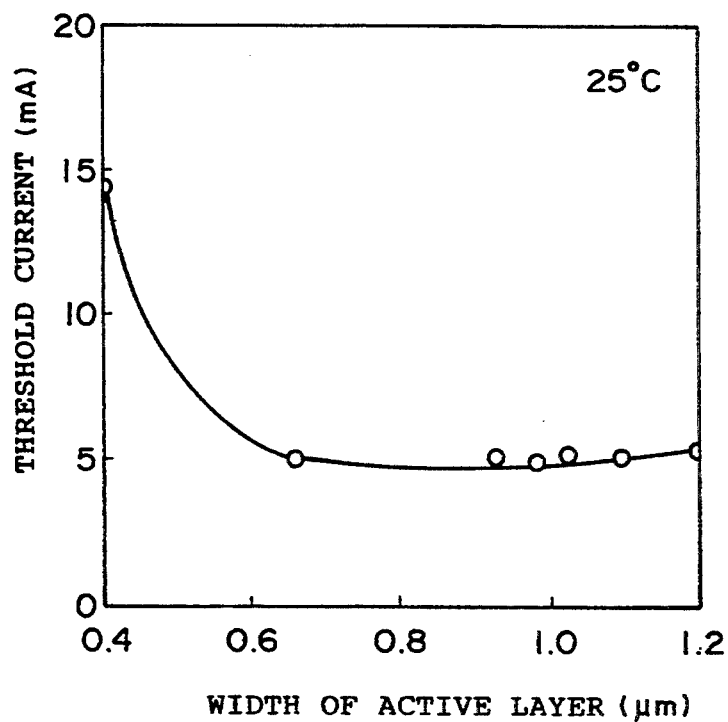
FIG. 3 is a drawing to show dependence of the threshold current on the width of the active layer for the buried semiconductor laser of the embodiment of the present invention.

Also, dependence of the threshold current of the buried semiconductor laser in the present embodiment was measured against the width of the active layer of the multiple quantum well structure. FIG. 3 shows the results of the measurement. The temperature in the measurement was +25° C.

As shown in FIG. 3, the threshold current increases with an increase in the width of the active layer 3 of the multiple quantum well structure, and the threshold current was not more than 7 mA in case of the width of the active layer 3 being not less than 0.7 μm. The threshold current increases as the temperature increases.

Considering the property of the threshold current, practically effective widths of the active layer 3 are preferably not less than 0.7 μm and not more than 1.0 μm.

The width and the thickness of the active layer 3 were measured with a scanning electron microscope (SEM).

Figure 4:
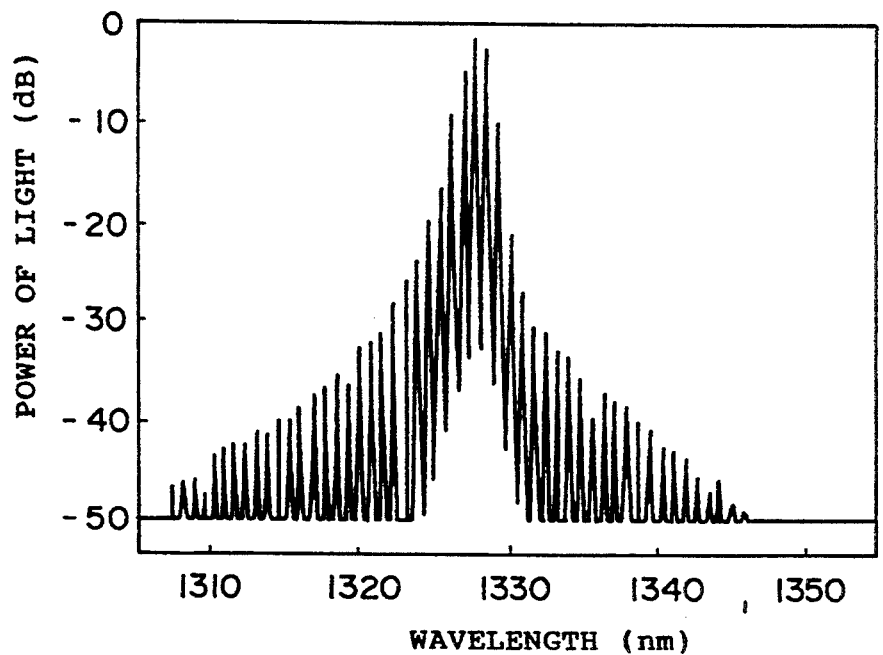
FIG. 4 is a drawing to show an oscillation spectrum of the buried semiconductor laser of the embodiment of the present invention.
Figure 5:
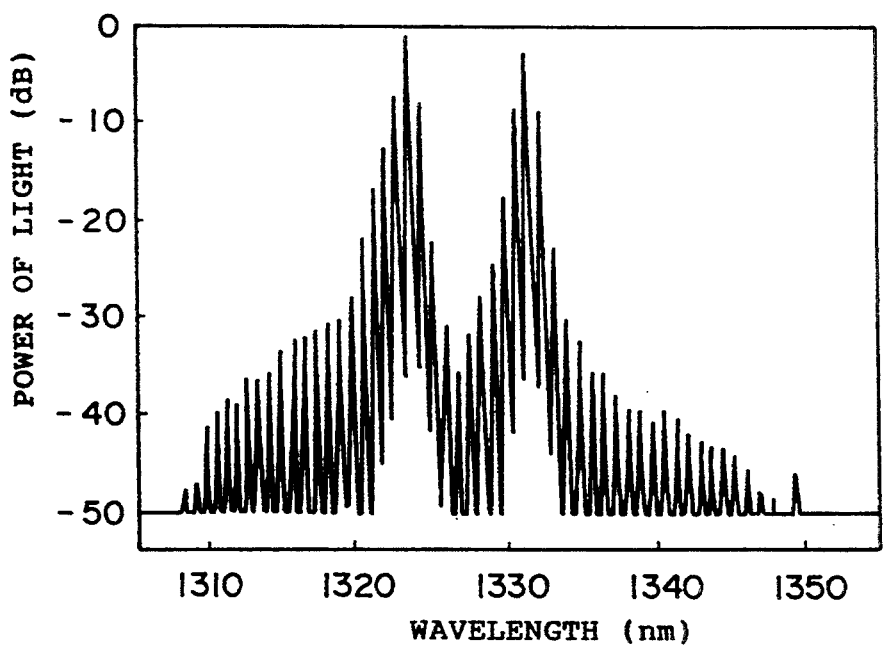
FIG. 5 is a drawing to show an oscillation spectrum of a conventional buried semiconductor laser.

FIG. 4 shows an oscillation spectrum obtained with the above buried semiconductor laser. For comparison, FIG. 5 shows an oscillation spectrum with the conventional arrangement in which the width of the active layer of the multiple quantum well structure is 1.2 μm. The temperature in the measurement was +65° C. As apparent from FIG. 5, the spectrum of the conventional buried semiconductor laser has double mode groups at +65° C. and the average spectral width (RMS method) is not less than 3.82 nm. As shown in FIG. 4, the spectral width (RMS method) of the buried semiconductor laser of the present embodiment was 0.74 nm and the spectral width was not more than 2.5 nm in the temperature range of −45° to +85° C. Thus, keeping the width of the active layer 3 in the range of 0.7 to 1.0 μm inclusive, the mode stability of the buried semiconductor laser was greatly improved as compared with the conventional semiconductor lasers.

Further, to verify the effectiveness of the present invention, structural factors of the buried semiconductor laser to achieve the above properties were investigated.

In the structure of the buried semiconductor laser shown in FIG. 1(a), the following structural factors were changed to examine the mode stability of the oscillation spectrum.

Second Embodiment

The same effect as above was achieved with a buried semiconductor laser in the following structure:
 the thickness of the active layer 3 of the multiple quantum well structure was about 0.069 μm;
 the thickness of the well layers was 60 angstroms and the number of the well layers was 4;
 the thickness of the barrier layers was 150 angstroms and the number of the barrier layers was 3;
 the width of the active layer 3 was about 0.9 μm;
 the thickness of the first guide layer 11 was about 0.06 μm; and
 the thickness of the second guide layer 12 was about 0.06 μm. Here, the thickness of the total optical waveguide layer (active layer 3+first guide layer 11+second guide layer 12) was 0.189 μm. The other parameters were the same as those shown in FIG. 1(a).

From the results with the above buried semiconductor laser of the second embodiment, the buried semiconductor laser of the present invention oscillates in a stable mode and at a low threshold current as long as the thickness of the total optical waveguide layer is at least 0.189 μm.

Since the thickness of the total optical waveguide layer for stable mode is 0.3 μm (where the thickness of the active layer 3 is 0.2 μm and the thicknesses of the first guide layer 11 and the second guide layer 12 were 0.05 μm) from the first embodiment, the above-described effect of the present invention can be achieved, taking the result of the second embodiment into consideration, by setting the width of the active layer 3 in the range of 0.7 to 1.0 μm if the thickness of the total optical waveguide layer is at least in the range of about 0.2 μm to 0.3 μm both inclusive. From the fact that in case of the thickness of the total optical waveguide layer being at least in the range of about 0.2 μm to 0.3 μm both inclusive and if from the result of the second embodiment the active layer consists of the GaInAsP layers in which the thickness of well layers is 60 angstroms and the thickness of barrier layers is 150 angstroms, the buried semiconductor laser of the present invention can oscillate in a stable mode and at a low threshold current, taking the result of the first embodiment into consideration, the same effect as above can be achieved as long as the thickness of the well layers is in the range of 30 to 60 angstroms and the thickness of the barrier layers in the range of 100 to 150 angstroms.

Similarly, the same effect as above can be achieved as long as the number of wells is 4 to 10, from the results of the first and second embodiments.

As for the compositions of the first light guide layer 11 and the second light guide layer 12, as the composition rate of Ga becomes higher, the energy band gap decreases and the refractive index increases, thus increasing the optical confinement factor $\Gamma$. It is, therefore, considered in this case that the width of the active layer needs to be slightly narrowed. Here, the optical confinement factor $\Gamma$ is a ratio of part present in the waveguide layer (active layer 3) among the total energy of guided light.

InP is normally used for the first clad layer 1, the second clad layer 2, the p-type InP buried layer 5, and the n-type InP buried layer 10, so that the conduction type or the carrier density thereof rarely affects the stability of mode as long as the thickness is sufficient as compared with oozing of light.

It was, however, verified that the width of the active layer 3 of the multiple quantum well structure having the above effect was dependent on the radiation wavelength, and it is, therefore, necessary for the active layer 3 to have the radiation wavelength of about 1.3 μm.

As described above, the embodiment of the present invention can have the following effects.

First, the mode instability incidence can be reduced by setting the width of the active layer 3 of the multiple quantum well structure as less than 1.0 μm.

Second, the threshold current can be made lower by setting the width of the active layer 3 of the multiple quantum well structure as not less than 0.7 μm.

Process for producing the buried semiconductor laser

FIG. 6A–6D are drawings to illustrate the process for producing the buried semiconductor laser of the embodiment of the present invention as shown in FIG. 1(a).

Figure 6A:
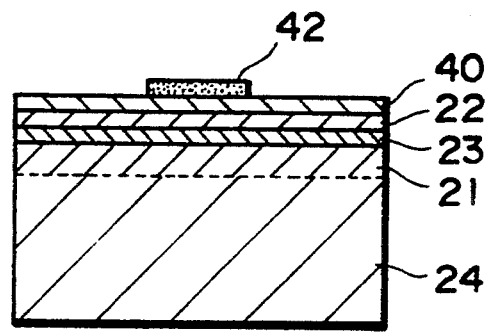
FIGS. 6A to 6D are explanatory drawings to illustrate a method for producing the buried semiconductor laser shown in FIG. 1(a)

First, successively formed on a Sn-doped n-type InP substrate 24 by the low-pressure metal organic vapor phase epitaxy (MOVPE) method are a Si-doped n-type InP first clad layer 21, an undoped $Ga_aIn_{1-a}As_bP_{1-b}$ (where a=0.15 and b=0.31) first light guide layer 31, an active layer 23 of the multiple quantum well structure, an undoped $Ga_cIn_{1-c}As_dP_{1-d}$ (where c=0.15 and d=0.31) second light guide layer 32, a p-type InP second clad layer 22, and an InGaAs cap layer 41. Then SiO$_2$ is deposited on the InGaAs cap layer 41 by the CVD method. This SiO$_2$ film is removed except for a stripe SiO$_2$ film 42 extending in the width of about 3 $\mu$m in the direction normal to the drawing (FIG. 6A). The active layer 23 of the multiple quantum well structure consists of well layers of Ga$_u$In$_{1-u}$As$_v$P$_{1-v}$ (where u=0.31 and v=0.66) and barrier layers of Ga$_x$In$_{1-x}$As$_y$P$_{1-y}$ (where x=0.15 and y=0.31). Wavelength-converted compositions of the well layers and the barrier layers are set as 1.36 $\mu$m and 1.1 $\mu$m, respectively.

Figure 6B:
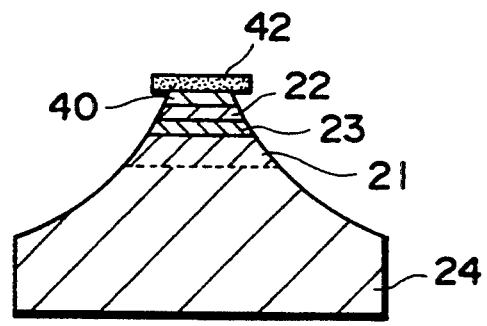

Next, using the stripe SiO$_2$, film 42 as a mask, the laminate is etched from the surface of the InGaAs cap layer 41 up to the n-type InP substrate 24 with bromine methanol (Br$_2$: methanol=2.5: 1000) fully cooled in ice water. The etching is continued for about five minutes while stirring the bromine methanol, forming a mesa structure in which the depth from the surface of the InGaAs cap layer 41 is about 2.0 $\mu$m and a side etching amount (undercut) of the stripe SiO$_2$ film 42 is 1.05 $\mu$m (FIG. 6B).

Figure 6C:
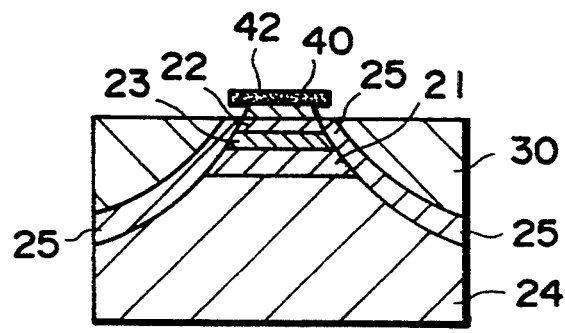

Subsequently, using the stripe SiO$_2$ film 42 as a mask for selective growth, a Zn-doped p-type InP buried layer 25 (in the thickness of about 1 $\mu$m) is deposited on the both side surfaces of the mesa by the low-pressure MOVPE method, and an n-type InP buried layer 30 (in the thickness of about 1 $\mu$m) is further deposited outside the p-type InP buried layer 25 (FIG. 6C). On this occasion, the p-type InP buried layer 25 and n-type InP buried layer 30 are deposited so as to decrease the thickness from the lower part to the upper part of the mesa, so that the upper surfaces thereof may become nearly parallel with the upper surface of the second clad layer 2.

Figure 6D:
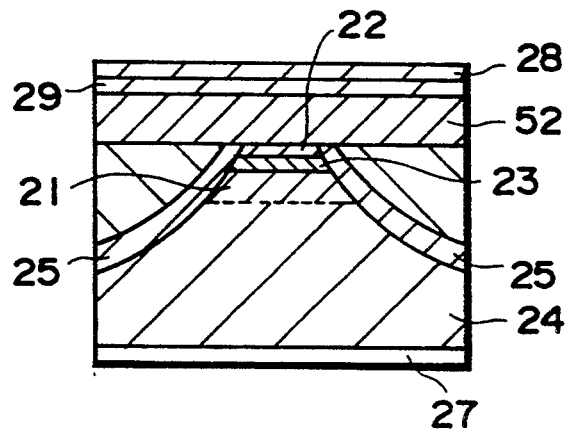

Then, the stripe SiO$_2$ film 42 is removed with hydrofluoric acid, and thereafter the InGaAs cap layer 41 is removed using a mixture solution of phosphoric acid and hydrogen peroxide (phosphoric acid: hydrogen peroxide=5:1). Then successively formed on the upper surface of the element by the low-pressure MOVPE method are a p-type InP third clad layer 52 (in the thickness of about 1.5 $\mu$m) and a Zn-doped p-type GaInAs contact layer 29 (in the thickness of about 0.5 $\mu$m). Finally, electrodes 28, 27 are formed on the upper layer of the p-type GaInAs contact layer 29 and on the lower surface of the InP substrate 24, respectively, thus obtaining the buried semiconductor laser shown in FIG. 1(a) (FIG. 6D).

As detailed above, the buried semiconductor laser of the present invention can be operated in the stable mode in the temperature range of −45° to +85° C. without provision of the temperature control device such as the Peltier cooler, enabling to be used in optical fiber communications at a high bit rate of 622 Mbps up to the fiber length of 15 km (according to CCITT standard G. 957).

Also, because the thickness of the active layer is set as not less than 0.7 $\mu$m, the threshold current of the buried semiconductor laser can be made not more than 7 mA, thus reducing the dissipation power.

What is claimed is:

1. A buried semiconductor laser comprising:
    a first clad layer of a first conduction type formed on a semiconductor substrate;
    an optical waveguide layer consisting of a first light guide layer formed on said first clad layer, an active layer of a multiple quantum well structure formed on said first light guide layer, and a second light guide layer formed on said active layer;
    a second clad layer of a second conduction type formed on said second light guide layer; and
    a buried layer provided in contact with both side surfaces of said optical waveguide layer formed in stripe structure;
    wherein a radiation wavelength of said active layer is about 1.3 $\mu$m; and
    wherein a width of said active layer is not less than 0.7 $\mu$m but less than 1.0 $\mu$m.

2. A buried semiconductor laser according to claim 1, wherein a thickness of said optical waveguide layer is not less than 0.2 $\mu$m and not more than 0.3 $\mu$m.

3. A buried semiconductor laser according to claim 2, wherein a number of wells in said active layer is 4 to 10.

4. A buried semiconductor laser according to claim 3, wherein:
    said semiconductor substrate is an n-type InP substrate;
    said first clad layer is an n-type InP layer;
    said first light guide layer and said second light guide layer are GaInAsP layers of a band gap wavelength of about 1.1 $\mu$m;
    said active layer of the multiple quantum well structure is so arranged that well layers are GaInAsP layers having a band gap wavelength of about 1.35 to 1.45 $\mu$m and a thickness of 30 to 60 angstroms and barrier layers are GaInAsP layers having a band gap wavelength of about 1.1 $\mu$m and a thickness of 100 to 150 angstroms and that the number of wells is about 10;
    said second clad layer is a p-type InP layer; and
    said buried layer is a lamination structure of a p-type InP layer and an n-type InP layer.

5. A buried semiconductor laser according to claim 4, wherein:
    said semiconductor substrate is a Sn-doped n-type InP substrate;
    said first clad layer is a Si-doped n-type InP layer;
    said first light guide layer is an undoped Ga$_a$In$_{1-a}$As$_b$P$_{1-b}$ layer (where a=0.15 and b=0.31);
    said active layer of the multiple quantum well structure is so arranged that the well layers are Ga$_u$In$_{1-u}$As$_v$P$_{1-v}$ layers (where u=0.31 and v=0.66) having the thickness of about 60 angstroms and the barrier layers are Ga$_x$In$_{1-x}$As$_y$P$_{1-y}$ layers (where x=0.15 and y=0.31) having the thickness of about 150 angstroms and that the number of wells is 10;
    said second light guide layer is an undoped Ga$_c$In$_{1-c}$As$_d$P$_{1-d}$ layer (where c=0.15 and d=0.31); and
    said second clad layer is a p-type inP layer.

* * * * *